United States Patent
Goto et al.

(10) Patent No.: US 12,515,243 B2
(45) Date of Patent: Jan. 6, 2026

(54) SUBSTRATE PROCESSING APPARATUS AND SUBSTRATE PROCESSING METHOD

(71) Applicant: Tokyo Electron Limited, Tokyo (JP)

(72) Inventors: Daisuke Goto, Kumamoto (JP); Jiro Higashijima, Kumamoto (JP); Nobuhiro Ogata, Kumamoto (JP); Yusuke Hashimoto, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 82 days.

(21) Appl. No.: 18/386,802

(22) Filed: Nov. 3, 2023

(65) Prior Publication Data

US 2024/0157408 A1    May 16, 2024

(30) Foreign Application Priority Data

Nov. 11, 2022 (JP) .................................. 2022-180659
Sep. 5, 2023 (JP) .................................. 2023-143569

(51) Int. Cl.
*B08B 3/02* (2006.01)
*B08B 5/02* (2006.01)

(52) U.S. Cl.
CPC ................ *B08B 3/022* (2013.01); *B08B 5/02* (2013.01); *B08B 2203/02* (2013.01)

(58) Field of Classification Search
CPC ........ B08B 3/022; B08B 5/02; B08B 2203/02
USPC ....................................................... 134/187
See application file for complete search history.

(56) References Cited

U.S. PATENT DOCUMENTS

2004/0196613 A1* 10/2004 Zheng ............... H01L 21/68735
                                                361/234
2009/0056764 A1*  3/2009 Minami ............ H01L 21/67034
                                                134/28

FOREIGN PATENT DOCUMENTS

JP         2007-335758 A      12/2007
JP         2018147979 A    *  9/2018

OTHER PUBLICATIONS

JP2018147979A—machine translation (Year: 2018).*
JP2007335758A—machine translation (Year: 2007).*

* cited by examiner

*Primary Examiner* — Tinsae B Ayalew
(74) *Attorney, Agent, or Firm* — Venjuris, P.C.

(57) ABSTRACT

A substrate processing apparatus includes a substrate holding unit, a rotation driving unit, a first rotational ring, a second rotational ring, and a first nozzle. The substrate holding unit includes a base plate and a plurality of gripping units that grips a peripheral edge of a substrate, and horizontally holds the substrate spaced apart from the base plate by the gripping units. The rotation driving unit rotates the substrate holding unit. The first rotational ring surrounds a peripheral edge of a lower surface of the substrate and rotates together with the substrate holding unit. The second rotational ring is provided outside the first rotational ring, surrounds a peripheral edge of an upper surface of the substrate, and rotates together with the substrate holding unit. The first nozzle ejects a cleaning liquid from above an entrance of a rotational flow path toward the entrance of the rotational flow path.

13 Claims, 19 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application Nos. 2022-180659 and 2023-143569, filed on Nov. 11, 2022 and Sep. 5, 2023, respectively, with the Japan Patent Office, the disclosures of which are incorporated herein in their entireties by reference.

TECHNICAL FIELD

The present disclosure relates to a substrate processing apparatus and a substrate processing method.

BACKGROUND

The substrate processing apparatus described in Japanese Patent Laid-Open Publication No. 2007-335758 includes a substrate holding unit that holds a substrate horizontally, a rotation driving unit that rotates the substrate together with the substrate holding unit, a rotational cup that surrounds the substrate held by the substrate holding unit and rotates together with the substrate holding unit, a nozzle that supplies a processing liquid to an upper surface of the substrate, and a nozzle that supplies the processing liquid to a lower surface of the substrate. The rotational cup includes a first rotational ring that guides the processing liquid, splashed from the lower surface of the rotating substrate, obliquely downward and a second rotational ring that guides the processing liquid, splashed from the upper surface of the rotating substrate, obliquely downward. The processing liquid includes a chemical liquid and a rinse liquid for removing the chemical liquid from the substrate.

SUMMARY

A substrate processing apparatus according to one aspect of the present disclosure includes a substrate holding unit, a rotation driving unit, a first rotational ring, a second rotational ring, and a first nozzle. The substrate holding unit includes a horizontal base plate and a plurality of gripping units that grips a peripheral edge of a substrate, and horizontally holds the substrate spaced apart from the base plate by the plurality of gripping units. The rotation driving unit rotates the substrate holding unit. The first rotational ring surrounds a peripheral edge of a lower surface of the substrate held by the substrate holding unit, and rotates together with the substrate holding unit. The second rotational ring is provided outside the first rotational ring, surrounds a peripheral edge of an upper surface of the substrate held by the substrate holding unit, and rotates together with the substrate holding unit. The first nozzle ejects a cleaning liquid from above an entrance of a rotational flow path toward the entrance of the rotational flow path, the rotational flow path being formed between the first rotational ring and the second rotational ring.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
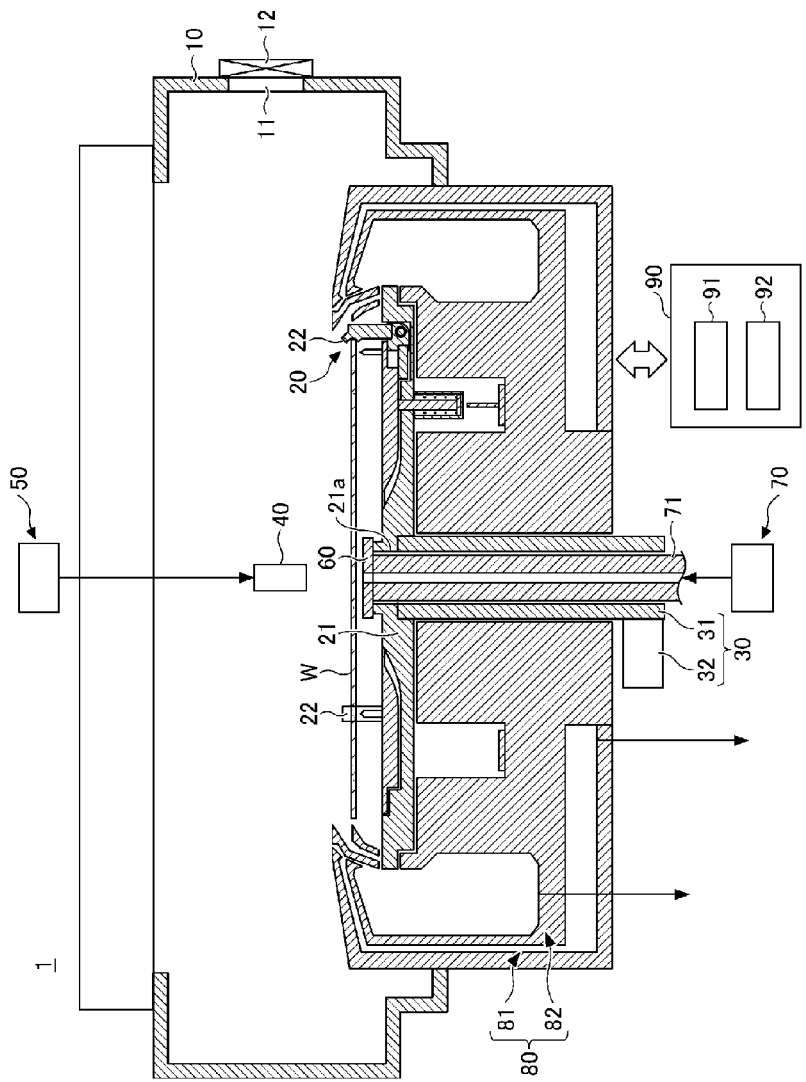
FIG. 1 is a cross-sectional view illustrating a substrate processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the accompanying drawings. In each drawing, the same reference numerals will be given to the same or corresponding components, and descriptions thereof may be omitted.

Referring to FIG. 1, a substrate processing apparatus 1 according to an embodiment will be described. The substrate processing apparatus 1 processes a substrate W by supplying a processing liquid to the substrate W. The substrate W is a semiconductor substrate such as a silicon wafer, or a glass substrate. The substrate processing apparatus 1 includes, for example, a processing container 10, a substrate holding unit 20, a rotation driving unit 30, a nozzle 40, a supply 50, a supply head 60, a supply 70, a recovery cup 80, and a controller 90.

The processing container 10 accommodates the substrate W. A gate 11 and a gate valve 12 for opening and closing the gate 11 are provided on a sidewall of the processing container 10. The substrate W is loaded to the inside of the processing container 10 through the gate 11 by a transfer device (not illustrated). Next, the substrate W is processed with a processing liquid in the inside of the processing container 10. Thereafter, the substrate W is unloaded to the outside of the processing container 10 through the gate 11 by the transfer device.

The substrate holding unit 20 holds the substrate W horizontally in the inside of the processing container 10. The substrate holding unit 20 includes, for example, a horizontal base plate 21 and a plurality of gripping units 22 that grips the peripheral edge of the substrate W. The plurality of gripping units 22 are equidistantly provided in the circumferential direction of the substrate W. The substrate holding unit 20 horizontally holds the substrate W spaced apart from the base plate 21 by the plurality of gripping units 22. A through-hole 21a is formed in the center of the base plate 21, and a supply pipe 71 to be described later is provided in the through-hole 21a.

The rotation driving unit 30 rotates the substrate holding unit 20, thereby rotating the substrate W together with the substrate holding unit 20. The rotation driving unit 30 includes, for example, a hollow rotational shaft 31 extending downward from the central through-hole 21a of the base plate 21 and a motor 32 that rotates the rotational shaft 31. The motor 32 rotates the rotational shaft 31, thereby rotating the substrate holding unit 20. The rotation centerline of the substrate holding unit 20 coincides with the center of the substrate W.

The nozzle 40 is arranged above the substrate W held by the substrate holding unit 20, and ejects the processing liquid toward an upper surface of the substrate W. The number of nozzles 40 is not particularly limited, and the nozzles 40 may be provided for each type of processing liquid. One nozzle 40 may sequentially eject multiple types of processing liquids. The nozzle 40 may also be a two-fluid nozzle and may eject the processing liquid in a mist form under gas pressure.

The processing liquid includes a chemical liquid and a rinse liquid for removing the chemical liquid from the substrate W. The chemical liquid is, for example, a mixed liquid of ammonia water and hydrogen peroxide water (SC1), a mixed liquid of sulfuric acid and hydrogen peroxide water (SPM), or dilute hydrofluoric acid (DHF). The rinse liquid is, for example, pure water such as deionized water (DIW). The processing liquid may also include an organic solvent such as isopropyl alcohol (IPA) that replaces the rinse liquid.

The supply 50 supplies the processing liquid to the nozzle 40. The supply 50 includes, for example, a supply line that delivers the processing liquid, and various devices provided along the supply line. The supply 50 includes, as various devices, an on-off valve, a flow meter, and a flow control valve. The supply 50 is provided for each nozzle 40.

The supply head 60 is arranged below the substrate W held by the substrate holding unit 20, and ejects the processing liquid toward a lower surface of the substrate W. The supply head 60 may eject a gas in addition to the processing liquid. The supply head 60 is provided at an upper end of the supply pipe 71, which will be described later, to close the central through-hole 21a in the base plate 21 and does not rotate together with the base plate 21.

The supply 70 includes the supply pipe 71 that supplies the processing liquid to the supply head 60. The supply pipe 71 is inserted through the inside of the hollow rotational shaft 31 and does not rotate together with the rotational shaft 31. The supply head 60 is provided at the upper end of the supply pipe 71. The supply 70 includes a supply line that delivers the processing liquid to the supply pipe 71, and various devices provided along the supply line. The supply 70 includes, as various devices, an on-off valve, a flow meter, and a flow control valve.

The recovery cup 80 collects the processing liquid supplied to the substrate W. The recovery cup 80 surrounds the peripheral edge of the substrate W held by the substrate holding unit 20 and receives the processing liquid splashed from the peripheral edge of the substrate W. The recovery cup 80 includes, for example, an exhaust cup 81 and a drain cup 82 arranged inside the exhaust cup 81.

The controller 90 is, for example, a computer and includes a processing unit 91 such as a central processing unit (CPU) and a storage 92 such as a memory. The storage 92 stores programs for controlling various processings executed in the substrate processing apparatus 1. The controller 90 causes the processing unit 91 to execute the programs stored in the storage 92, thereby controlling the operation of the substrate processing apparatus 1.

Next, a substrate processing method using the substrate processing apparatus 1 illustrated in FIG. 1 will be described. First, the transfer device (not illustrated) loads the substrate W from the outside to the inside of the processing container 10 and transfers the substrate W to the substrate holding unit 20. Next, the substrate holding unit 20 holds the substrate W horizontally, and the rotation driving unit 30 rotates the substrate W together with the substrate holding unit 20. Next, the supply 50 and the supply 70 supply the processing liquid to the substrate W. Thereafter, the supply 50 and the supply 70 stop the supply of the processing liquid, and the rotation driving unit 30 rotates the substrate W together with the substrate holding unit 20 to dry the substrate W. Thereafter, the substrate holding unit 20 releases the held substrate W, and transfers the substrate W to the transfer device. Finally, the transfer device unloads the substrate W from the inside to the outside of the processing container 10.

Figure 2:
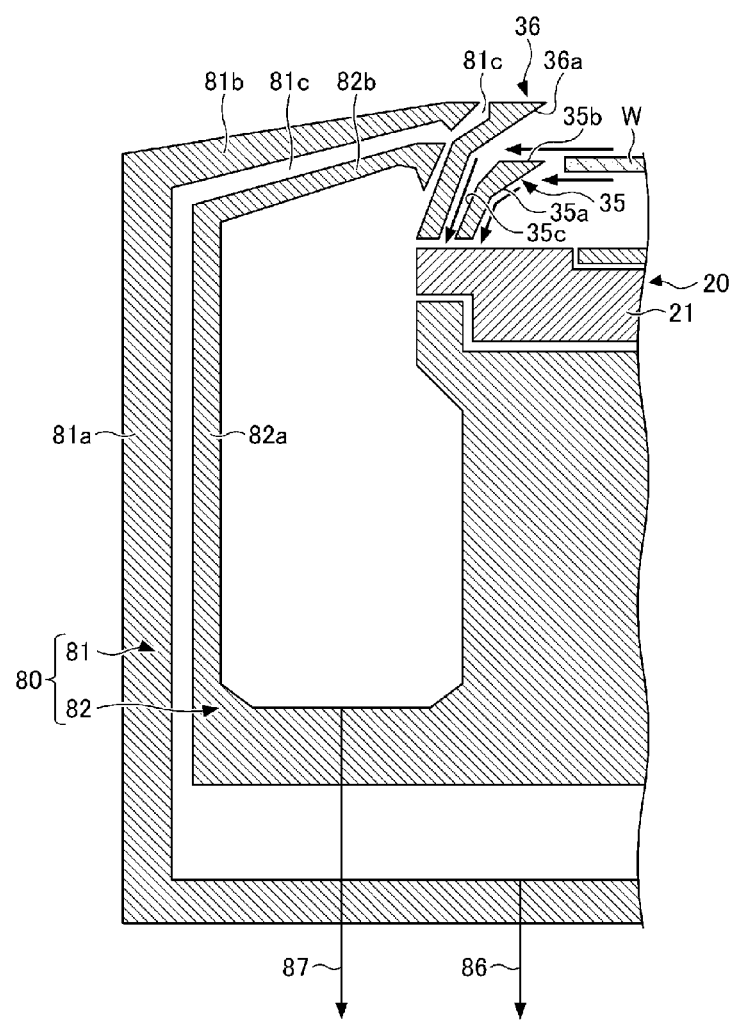
FIG. 2 is a partial enlarged view of FIG. 1.

Next, referring to FIG. 2, an example of a first rotational ring 35 and a second rotational ring 36 will be described. The substrate processing apparatus 1 includes the first rotational ring 35 and the second rotational ring 36. The first rotational ring 35 surrounds the peripheral edge of the lower surface of the substrate W held by the substrate holding unit 20 and rotates together with the substrate holding unit 20. The second rotational ring 36 is provided outside the first rotational ring 35, surrounds the peripheral edge of the upper surface of the substrate W held by the substrate holding unit 20, and rotates together with the substrate holding unit 20.

The first rotational ring 35 has an inner peripheral surface 35a that slopes downward in the radial outward direction of the substrate W, and guides the processing liquid, splashed from the lower surface of the rotating substrate W, obliquely downward, thereby preventing the splashing of the processing liquid. A gap is formed between the first rotational ring 35 and the base plate 21 to eject the processing liquid.

The first rotational ring 35 has a horizontal upper surface 35b that is higher than the lower surface of the substrate W and lower than the upper surface of the substrate W. The processing liquid, which has been splashed from the upper surface of the rotating substrate W, passes over the upper surface 35b of the first rotational ring 35 and is received at an inner peripheral surface 36a of the second rotational ring 36, thus flowing obliquely downward along the inner peripheral surface 36a.

The second rotational ring 36 has the inner peripheral surface 36a that slopes downward in the radial outward direction of the substrate W, and guides the processing liquid, splashed from the upper surface of the rotating substrate W, obliquely downward, thereby preventing the splashing of the processing liquid. A gap is formed between the second rotational ring 36 and the base plate 21 to eject the processing liquid.

Each of the first rotational ring 35 and the second rotational ring 36 may be made of a ceramic material. The ceramic material is not particularly limited, but is, for example, an aluminum oxide or silicon carbide. The ceramic material has excellent chemical resistance and heat resistance, compared to a resin. Therefore, it may prevent deterioration such as whitening, swelling, or deformation, and thus, may reduce the frequency of maintenance.

The first rotational ring 35 and the second rotational ring 36 are fixed to the base plate 21 with spacers and connection pins, among others. These spacers and connection pins may be made of a resin having flexibility and chemical resistance, for example, fluororesin, respectively. A specific example of fluororesin may be polytetrafluoroethylene (PTFE).

The base plate 21 may be composed of a plurality of components. This allows for the replacement of only some components, thus improving maintainability. Components that are likely to come into contact with the chemical liquid may be made of a ceramic material, while components that are less likely to come into contact with the chemical liquid may be made of fluororesin. A specific example of fluororesin may be perfluoroalkoxyalkane (PFA). A lift plate 23 to be described later may also be composed of a plurality of components, similar to the base plate 21.

Next, referring to FIG. 2 again, an example of the recovery cup 80 will be described. Unlike the first rotational ring 35 and the second rotational ring 36, the recovery cup 80 does not rotate together with the substrate holding unit 20. The recovery cup 80 includes the exhaust cup 81 and the drain cup 82 arranged inside the exhaust cup 81. The exhaust cup 81 forms an exhaust flow path 81c between the second rotational ring 36 and the drain cup 82.

The exhaust cup 81 has a vertical hollow cylindrical portion 81a and a ring-shaped inclined portion 81b provided at an upper end of the cylindrical portion 81a. The inclined portion 81b slopes upward in the radial inward direction, thus guiding a gas obliquely downward. The exhaust flow path 81c is connected to an exhaust line 86, and the exhaust line 86 is provided with various devices (e.g., an on-off valve and a flow control valve).

The drain cup 82 has a vertical hollow cylindrical portion 82a and a ring-shaped inclined portion 82b provided at an upper end of the cylindrical portion 82a. The inclined portion 82b slopes upward in the radial inward direction, thus guiding the processing liquid obliquely downward. The drain cup 82 has a chamber therebelow that stores the processing liquid. The chamber is connected to a drain line 87, and the drain line 87 is provided with various devices (e.g., an on-off valve and a flow control valve).

Figure 3:
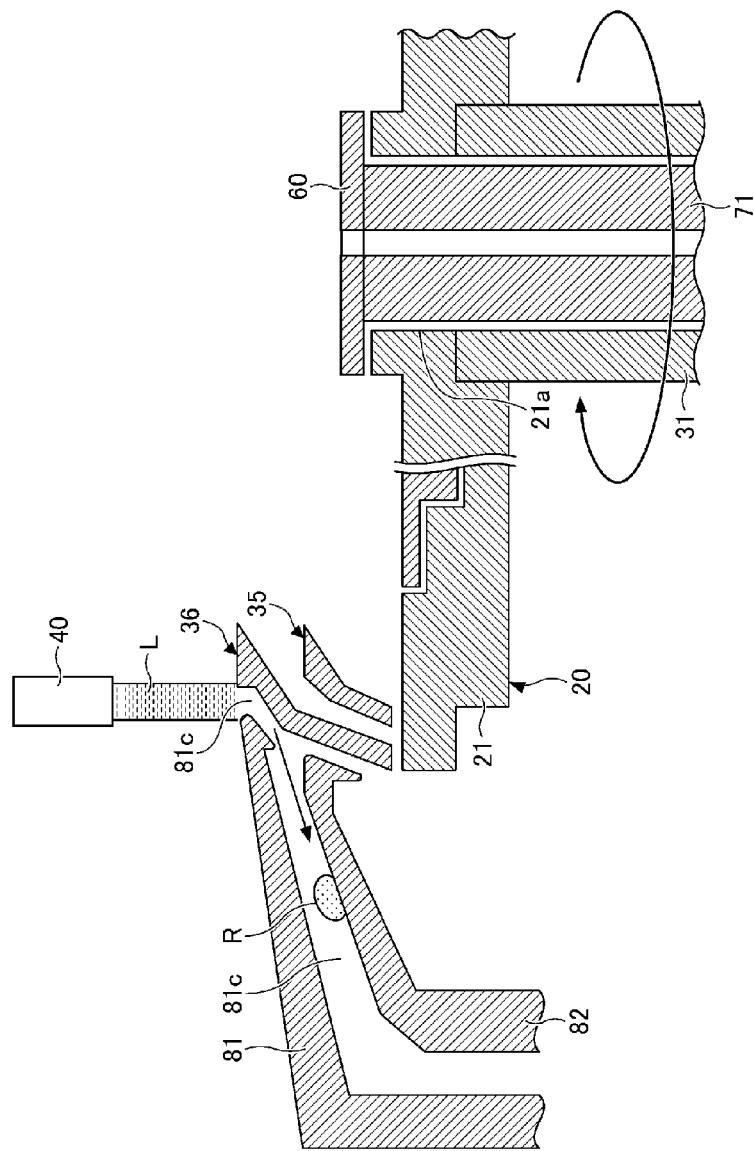
FIG. 3 is a cross-sectional view illustrating an example of a step of cleaning an exhaust flow path.

Next, referring to FIGS. 3 and 4, an example of cleaning of the exhaust flow path 81c will be described. During the processing of the substrate W, a gas vaporized from a chemical liquid, or a mist-like chemical liquid flows into the exhaust flow path 81c, leading to the adherence of a residue (e.g., crystals) R of the chemical liquid. The residue R is a cause of particles adhering to the substrate W or clogging in the exhaust flow path 81c.

Therefore, the controller 90 performs control to arrange the nozzle 40 above the entrance of the exhaust flow path 81c and to eject a cleaning liquid L from the nozzle 40 toward the entrance of the exhaust flow path 81c. This control is performed periodically while the substrate holding unit 20 does not hold the substrate W. The cleaning liquid L is not particularly limited as long as it is capable of removing the residue R, but is, for example, a rinse liquid such as DIW. The cleaning liquid L removes the residue R, for example, by dissolving the residue R.

Figure 4:
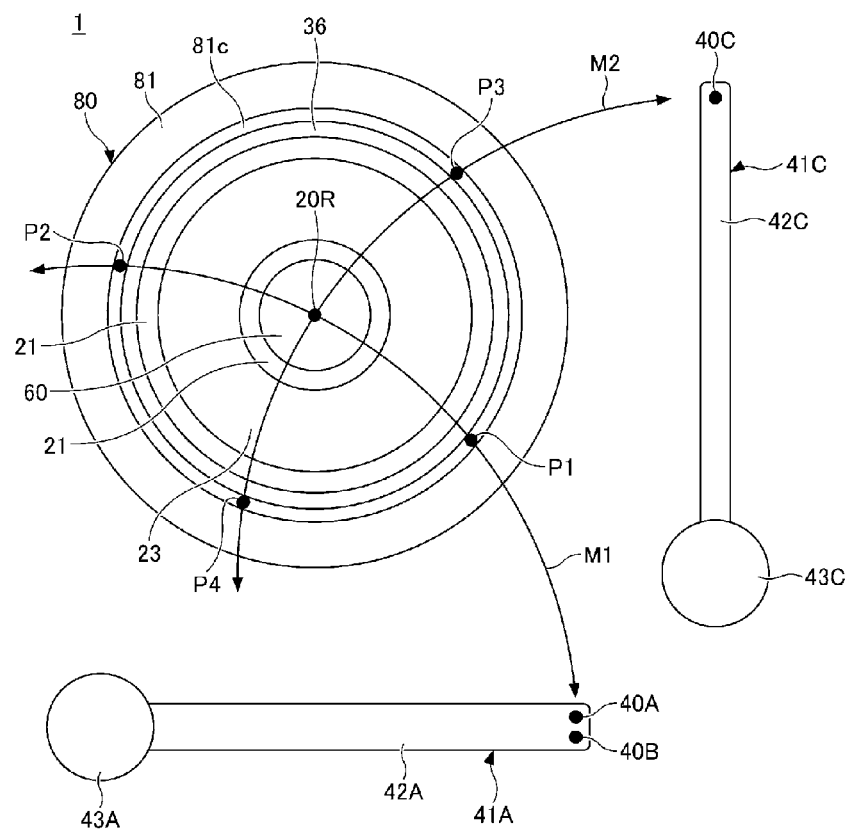
FIG. 4 is a plan view illustrating an example of the movement trajectory of a first nozzle and the movement trajectory of a third nozzle.

In the cleaning of the exhaust flow path 81c, for example, a first nozzle 40A and a third nozzle 40C illustrated in FIG. 4 are used as the nozzle 40. A first nozzle mover 41A moves the first nozzle 40A in a direction perpendicular to the rotation centerline 20R of the substrate holding unit 20. A third nozzle mover 41C moves the third nozzle 40C in a direction perpendicular to the rotation centerline 20R of the substrate holding unit 20.

The first nozzle mover 41A includes a pivoting arm 42A that holds the first nozzle 40A and a driving unit 43A that drives the pivoting arm 42A. The driving unit 43A is in charge of pivotal driving of the pivoting arm 42A or up-and-down driving of the pivoting arm 42A. The pivoting arm 42A may not be provided, and the first nozzle 40A may move linearly along a guide.

The third nozzle mover 41C includes a pivoting arm 42C that holds the third nozzle 40C and a driving unit 43C that drives the pivoting arm 42C. The driving unit 43C is in charge of pivotal driving of the pivoting arm 42C or up-and-down driving of the pivoting arm 42C. The pivoting arm 42C may not be provided, and the third nozzle 40C may move linearly along a guide.

When viewed from above, a movement trajectory M1 of the first nozzle 40A and a movement trajectory M2 of the third nozzle 40C intersect (particularly orthogonally) at the rotation centerline 20R of the substrate holding unit 20. The movement trajectories M1 and M2 being orthogonal when viewed from above means that the movement trajectories M1 and M2 intersect at an angle of 90°±10°.

Further, when viewed from above, the movement trajectory M1 of the first nozzle 40A and the inner periphery of the exhaust cup 81 intersect at a first point P1 and a second point P2. Furthermore, when viewed from above, the movement trajectory M2 of the third nozzle 40C and the inner periphery of the exhaust cup 81 intersect at a third point P3 and a fourth point P4. The first point P1, the second point P2, the third point P3, and the fourth point P4 may be equidistantly arranged in the circumferential direction.

The controller 90 performs a control that the first nozzle 40A ejects the cleaning liquid L toward the entrance of the exhaust flow path 81c at each of the first point P1 and the second point P2, and a control that the third nozzle 40C ejects the cleaning liquid L toward the entrance of the exhaust flow path 81c at each of the third point P3 and the fourth point P4. This allows the cleaning liquid L to be supplied over a wider range, leading to the removal of the residue R over a wider range, compared to ejecting the cleaning liquid L at only the first point P1, the second point P2, and the third point P3 excluding the fourth point P4.

The first nozzle 40A ejects the cleaning liquid L while the first nozzle mover 41A stops the first nozzle 40A at the first point P1 or the second point P2. During this time, the rotation driving unit 30 may rotate the second rotational ring 36 together with the substrate holding unit 20. This may spread the cleaning liquid L in the rotation direction of the second rotational ring 36.

The exhaust cup 81 does not rotate when the second rotational ring 36 rotates. By rotating the second rotational ring 36 inside the stationary exhaust cup 81, it is possible to spread the cleaning liquid L the rotation direction of the second rotational ring 36 along the inner periphery of the stationary exhaust cup 81.

While the first nozzle mover 41A stops the first nozzle 40A at the first point P1 or the second point P2 and the first nozzle 40A ejects the cleaning liquid L, the rotation driving unit 30 may reverse the rotation direction of the second rotational ring 36. Reversing the rotation direction allows the cleaning liquid L to spread in both the clockwise and counterclockwise directions.

Similarly, the third nozzle 40C ejects the cleaning liquid L while the third nozzle mover 41C stops the third nozzle 40C at the third point P3 or the fourth point P4. During this time, the rotation driving unit 30 may rotate the second rotational ring 36 together with the substrate holding unit 20, and particularly, may reverse the rotation direction.

A step in which the first nozzle 40A ejects the cleaning liquid L at the first point P1 and a step in which the third nozzle 40C ejects the cleaning liquid L at the third point P3 may overlap at least partially (particularly entirely) to shorten the processing time. Further, a step in which the first nozzle 40A ejects the cleaning liquid L at the second point P2 and a step in which the third nozzle 40C ejects the cleaning liquid L at the fourth point P4 may overlap at least partially (particularly entirely) to shorten the processing time.

Figure 5:
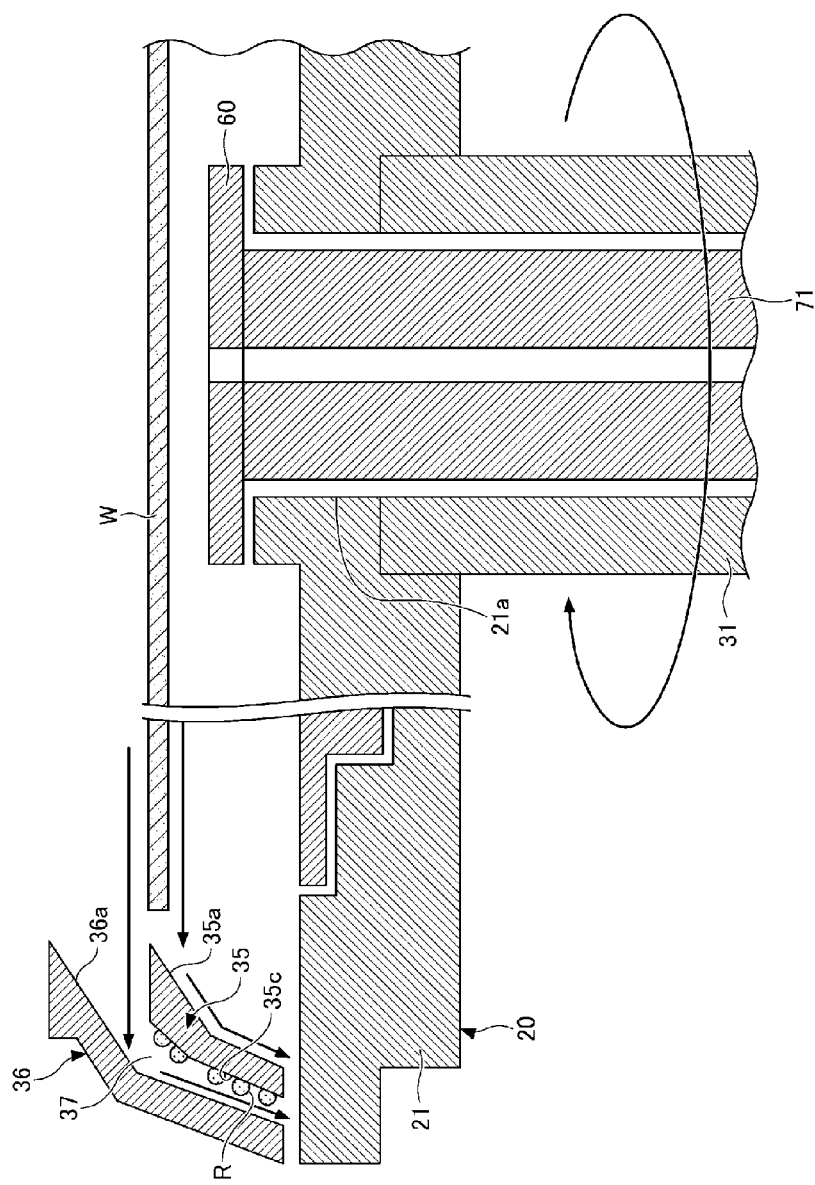
FIG. 5 is a cross-sectional view illustrating an example of a residue of a chemical liquid remaining in a rotational flow path.

Next, referring to FIGS. 5 to 9, an example of cleaning of a rotational flow path 37 will be described. As illustrated in FIG. 5, the rotational flow path 37 is formed between an outer peripheral surface 35c of the first rotational ring 35 and the inner peripheral surface 36a of the second rotational ring 36. During the processing of the substrate W, the chemical liquid flows into the rotational flow path 37, thus leaving the residue R of the chemical liquid. The residue R is a cause of particles adhering to the substrate W or clogging in the rotational flow path 37.

The rinse liquid also flows into the rotational flow path 37 during the processing of the substrate W. The rinse liquid is capable of removing the residue R. However, the rinse liquid is pressed against the inner peripheral surface 36a of the second rotational ring 36 by the centrifugal force since the rotational flow path 37 is rotating. Therefore, the flow of rinse liquid is less vigorous on the outer peripheral surface 35c of the first rotational ring 35 than on the inner peripheral surface 36a of the second rotational ring 36, making it more likely for the residue R to remain.

Figure 7:
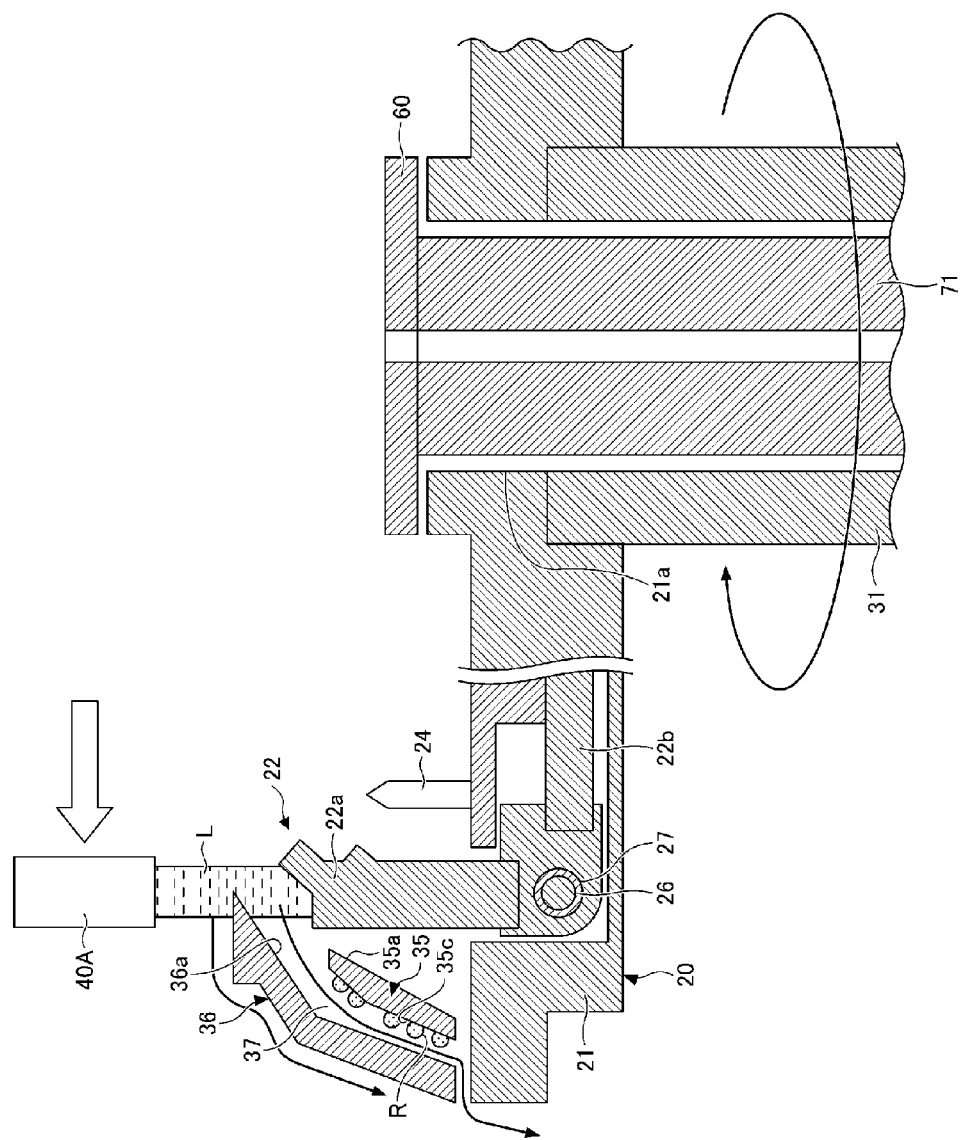
FIG. 7 is a cross-sectional view illustrating another example of the step in which the first nozzle ejects the cleaning liquid into the rotational flow path.

The residue R tends to remain particularly near the gripping units 22 (see, e.g., FIG. 7). This is because the gripping units 22 block the flow of rinse liquid being splashed from the upper surface of the rotating substrate W in the radial outward direction of the substrate W. The rinse liquid is supplied to the center of the upper surface of the rotating substrate W and spreads radially by the centrifugal force, thus being simultaneously splashed from the entire peripheral edge of the substrate W.

When the rinse liquid is supplied to the upper surface of the substrate W that is rotating together with the substrate holding unit 20, the rinse liquid spreads radially on the upper surface of the substrate W, thereby reaching the entire circumferential direction of the rotational flow path 37 in a dispersed manner Therefore, the flow of rinse liquid is less vigorous in the rotational flow path 37 compared to directly below the nozzle 40. This is also a cause of the residue R remaining in the rotational flow path 37.

Figure 6:
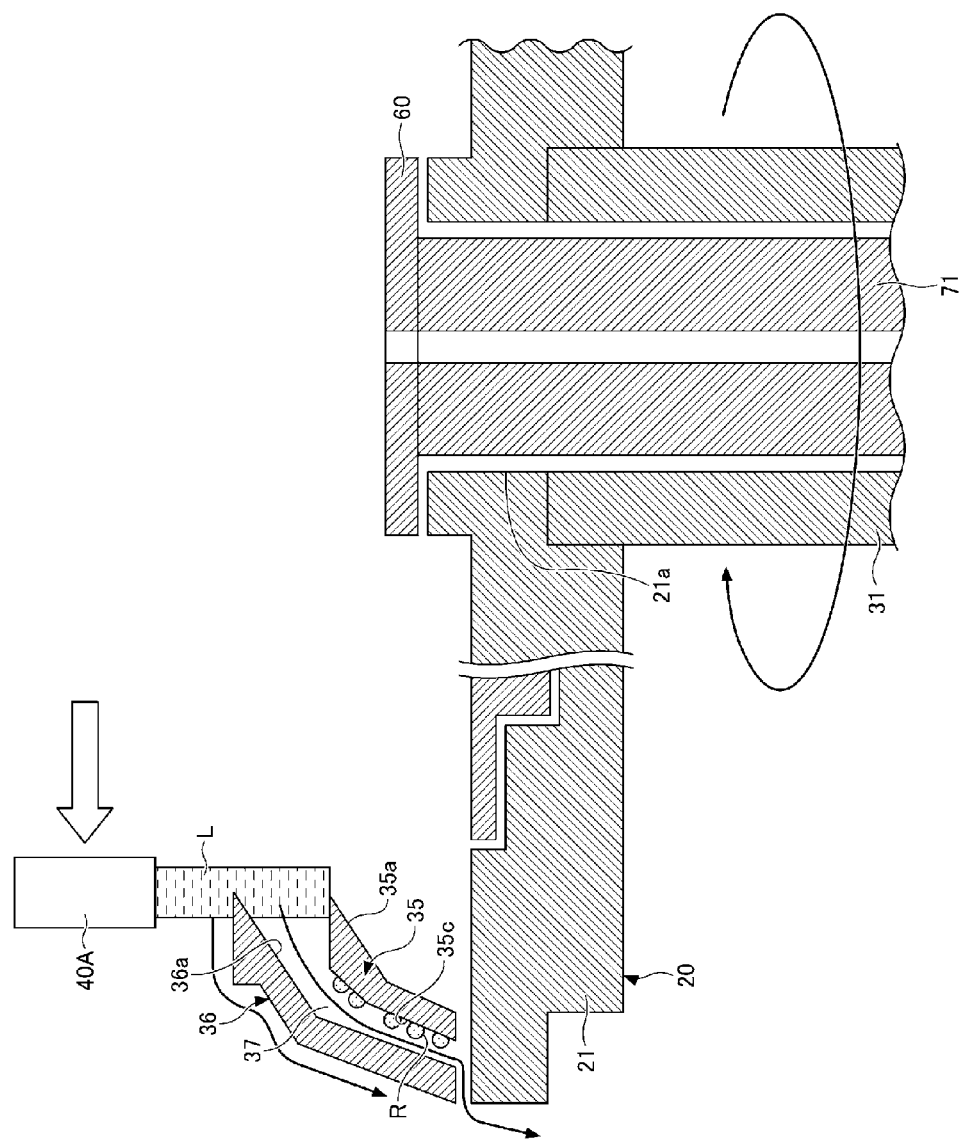
FIG. 6 is a cross-sectional view illustrating an example of a step in which the first nozzle ejects a cleaning liquid into the rotational flow path.

As illustrated in FIG. 6, the controller 90 performs control to arrange the first nozzle 40A above the entrance of the rotational flow path 37 and to eject the cleaning liquid L from the first nozzle 40A toward the entrance of the rotational flow path 37. This control is performed periodically while the substrate holding unit 20 does not hold the substrate W. The cleaning liquid L is not particularly limited as long as it is capable of removing the residue R, but is, for example, a rinse liquid such as DIW.

The first nozzle 40A ejects the cleaning liquid L from above the entrance of the rotational flow path 37 toward the entrance of the rotational flow path 37. This may concentrate the supply of the cleaning liquid L at a single point where the first nozzle 40A and the rotational flow path 37 overlap when viewed from above, resulting in the enhanced flow of cleaning liquid L and more efficient removal of the residue R. In particular, as illustrated in FIG. 7, the flow of cleaning liquid L may also be enhanced even near the gripping units 22, allowing for the efficient removal of the residue R.

The first nozzle 40A is arranged, for example, directly above the entrance of the rotational flow path 37 and ejects the cleaning liquid L directly downward in a columnar shape. This allows the flow of cleaning liquid L to enter the rotational flow path 37 downward, allowing for the efficient removal of the residue R. The first nozzle 40A supplies the cleaning liquid L to the entrance of the rotational flow path 37, and simultaneously, supplies the cleaning liquid L to the second rotational ring 36. The second rotating ring 36 may also be cleaned.

The controller 90 performs a control that the first nozzle 40A ejects the cleaning liquid L toward the entrance of the rotational flow path 37 while the first nozzle mover 41A stops the first nozzle 40A, and the rotation driving unit 30 rotates the first rotational ring 35 and the second rotational ring 36 together with the substrate holding unit 20. This allows for the efficient removal of the residue R throughout the circumferential direction of the rotational flow path 37. The rotation direction of the substrate holding unit 20 may be constant and may not be reversed.

The controller 90 may perform a control that the first nozzle 40A ejects the cleaning liquid L toward the substrate holding unit 20 while the first nozzle mover 41A moves the first nozzle 40A in a direction perpendicular to the rotation centerline 20R of the substrate holding unit 20, and the rotation driving unit 30 rotates the substrate holding unit 20. This allows for the cleaning of a wide range of the substrate holding unit 20 with the cleaning liquid L. The movement direction of the first nozzle 40A may be either the radial outward direction or the radial inward direction and may also be reversed.

Figure 8:
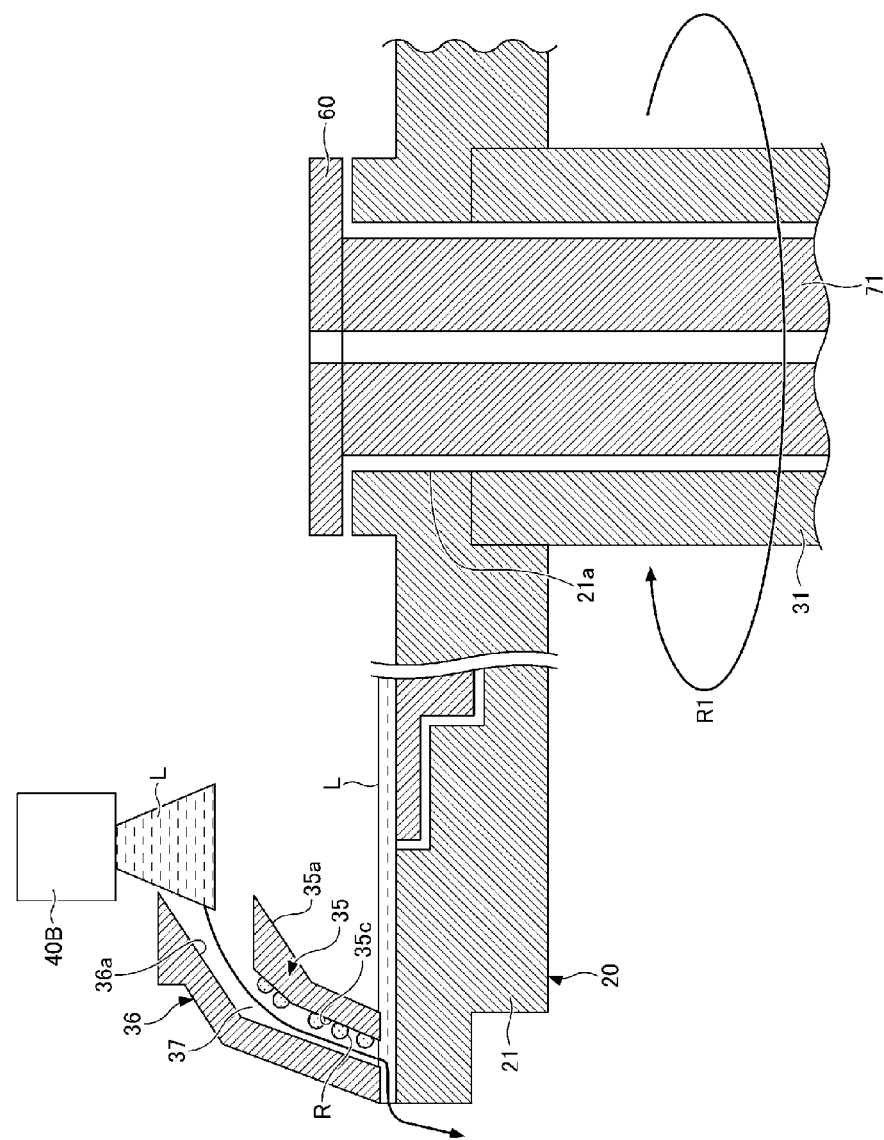
FIG. 8 is a cross-sectional view illustrating an example of a step in which a second nozzle ejects a cleaning liquid into the rotational flow path.
Figure 9:
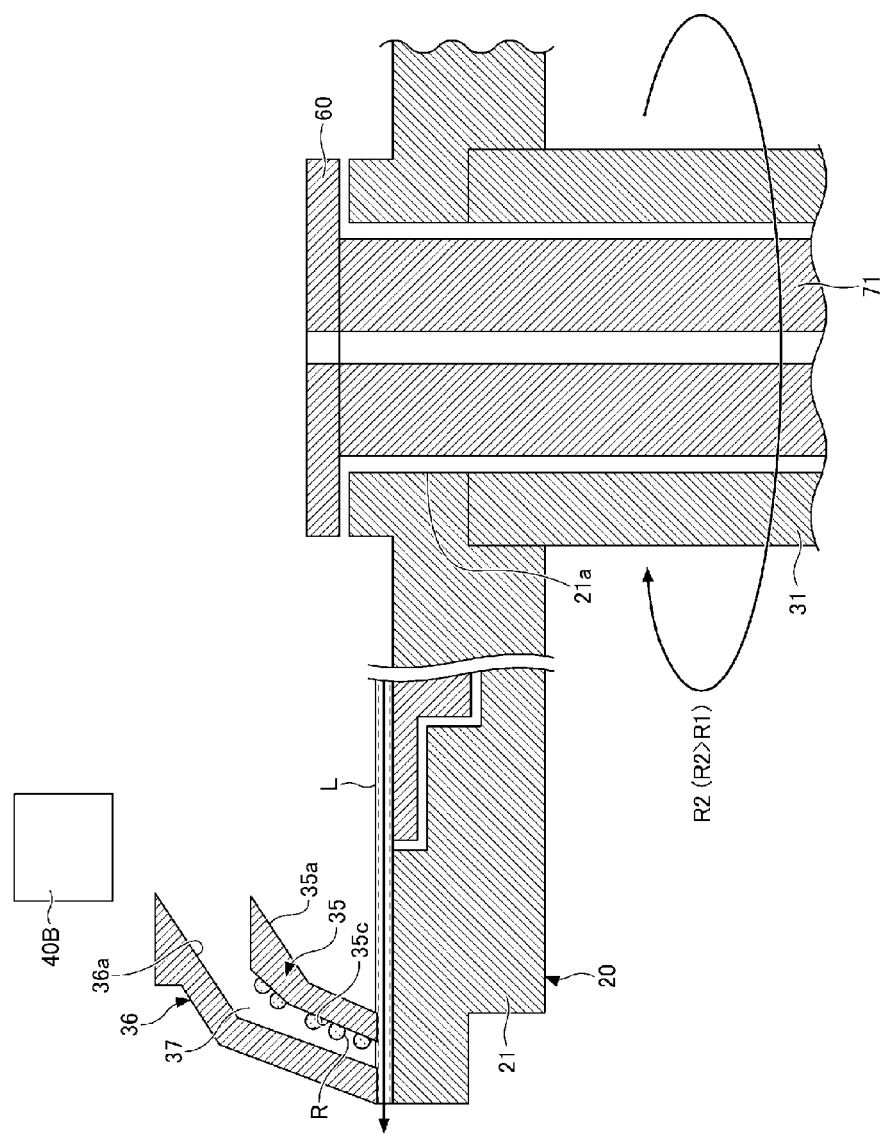
FIG. 9 is a cross-sectional view illustrating an example of a step of ejecting the cleaning liquid after the step of FIG. 8.

As illustrated in FIG. 8, the substrate processing apparatus 1 includes a second nozzle 40B that ejects the cleaning liquid L in a mist form from above the entrance of the rotational flow path 37 toward the entrance of the rotational flow path 37. By atomizing the cleaning liquid L, it becomes easier for the cleaning liquid L to enter the rotational flow path 37. The second nozzle 40B may be a two-fluid nozzle that ejects the cleaning liquid L in a mist form under gas pressure. This allows for the cleaning liquid L to be atomized under gas pressure and also enhances the flow of the cleaning liquid L under gas pressure.

The second nozzle 40B moves, together with the first nozzle 40A, in a direction perpendicular to the rotation centerline 20R of the substrate holding unit 20 (see, e.g., FIG. 4). The first nozzle mover 41A moves both the first nozzle 40A and the second nozzle 40B. The first nozzle 40A and the second nozzle 40B may be replaced within a short time. The second nozzle 40B ejects the cleaning liquid L in a mist from that spreads downward and outward. The second nozzle 40B is, for example, arranged obliquely relative to the entrance of the rotational flow path 37 and ejects the cleaning liquid L from radially inward of the entrance of the rotational flow path 37 toward the entrance of the rotational flow path 37.

The controller 90 performs a control that the second nozzle 40B ejects the cleaning liquid L toward the entrance of the rotational flow path 37 while the first nozzle mover 41A stops the second nozzle 40B, and the rotation driving unit 30 rotates the first rotational ring 35 and the second rotational ring 36 together with the substrate holding unit 20. This allows for the efficient removal of the residue R throughout the circumferential direction of the rotational flow path 37. The rotation direction of the substrate holding unit 20 may be constant and may not be reversed.

When the second nozzle 40B is a two-fluid nozzle, it enhances the flow of the cleaning liquid L. Therefore, the substrate holding unit 20 is set to a low rotational speed to prevent the cleaning liquid L from splashing due to impacts when the cleaning liquid L collides with the substrate holding unit 20. However, when the rotational speed of the substrate holding unit 20 is low, the cleaning liquid L is likely to be collected on the substrate holding unit 20. The collection of the cleaning liquid L increases the likelihood of splashing of the cleaning liquid L despite the low rotational speed.

Therefore, the controller 90 alternately repeats the following control (A) and the following control (B): (A) while the second nozzle 40B ejects the cleaning liquid L toward the entrance of the rotational flow path 37, the rotation driving unit 30 rotates the substrate holding unit 20 at a first rotational speed R1 (see, e.g., FIG. 8); and (B) while the second nozzle 40B stops the eject of the cleaning liquid L, the rotation driving unit 30 rotates the substrate holding unit 20 at a second rotational speed R2 (see, e.g., FIG. 9). The second rotational speed R2 is greater than the first rotational speed R1.

Under the above-described control (A), while the second nozzle 40B ejects the cleaning liquid L, the rotation driving unit 30 rotates the substrate holding unit 20 at the first rotational speed R1 smaller than the second rotational speed R2. This may prevent impacts when the cleaning liquid L collides with the substrate holding unit 20, thus preventing the splashing of the cleaning liquid L.

Under the above-described control (B), while the second nozzle 40B stops the eject of the cleaning liquid L, the rotation driving unit 30 rotates the substrate holding unit 20 at the second rotational speed R2 greater than the first rotational speed RE This allows for the eject of the cleaning liquid from the top of the substrate holding unit 20 by a strong centrifugal force. By alternately repeating the control (A) and the control (B), it is possible to prevent the splashing of the cleaning liquid L.

Next, referring to FIGS. 10 and 11, an example of the substrate holding unit 20 will be described. The substrate holding unit 20 includes, for example, a lift plate 23, a lift pin 24, and a lifting unit 25, in addition to the base plate 21 and the gripping units 22. The lift plate 23 is provided on the base plate 21 to be movable up and down. The lift plate 23 is moved up and down between a lowered position illustrated in FIG. 10 and a raised position illustrated in FIG. 11. The lift pin 24 protrudes upward from the lift plate 23 to support the substrate W from below. The lifting unit 25 moves both the lift pin 24 and the lift plate 23 up and down. This allows for the transfer of the substrate W between the substrate holding unit 20 and the transfer device (not illustrated).

The lift plate 23 is formed in a disc shape. A through-hole 23a is formed in the center of the lift plate 23. The through-hole 23a in the lift plate 23 is concentrically aligned with the through-hole 21a in the base plate 2 and is larger than the through-hole 21a in the base plate 21.

A plurality of (e.g., three) lift pins 24 are provided on an upper surface of the lift plate 23. The plurality of lift pins 24 are equidistantly provided in the circumferential direction of the lift plate 23, and support the lower surface of the substrate W, as illustrated in FIG. 11. As illustrated in FIG. 10, when the gripping units 22 grip the peripheral edge of the substrate W, the lift pins 24 are located below the lower surface of the substrate W.

The lifting unit 25 includes, for example, a rod 25a, a flange 25b, a spring 25c, and a cylinder 25d. The rod 25a passes through a through-hole in the base plate 21 and comes into contact with a lower surface of the lift plate 23. The flange 25b is provided at a lower end of the rod 25a. The rod 25a moves up and down together with the flange 25b. The spring 25c is interposed between the base plate 21 and the flange 25b and continuously presses the flange 25b downward. The cylinder 25d is provided on a lower surface of the base plate 21 and accommodates the flange 25b and the spring 25c. A plurality of (e.g., three) lifting units 25 are equidistantly provided in the circumferential direction of the base plate 21.

The lifting units 25 are driven by a driving unit 89. The driving unit 89 includes a plurality of rods 89a corresponding to a plurality of rods 25a, a ring-shaped disc 89b having an upper surface on which the plurality of rods 89a are erected, and a driving source 89c that moves up and down the disc 89b. Each rod 89a passes through a through-hole in a lower surface of the cylinder 25d and comes into contact with a lower surface of the flange 25b. The driving unit 89 does not rotate together with the substrate holding unit 20. Therefore, the rod 89a of the driving unit 89 deviates outside the cylinder 25d during the rotation of the substrate holding unit 20, as illustrated in FIG. 10.

Figure 10:
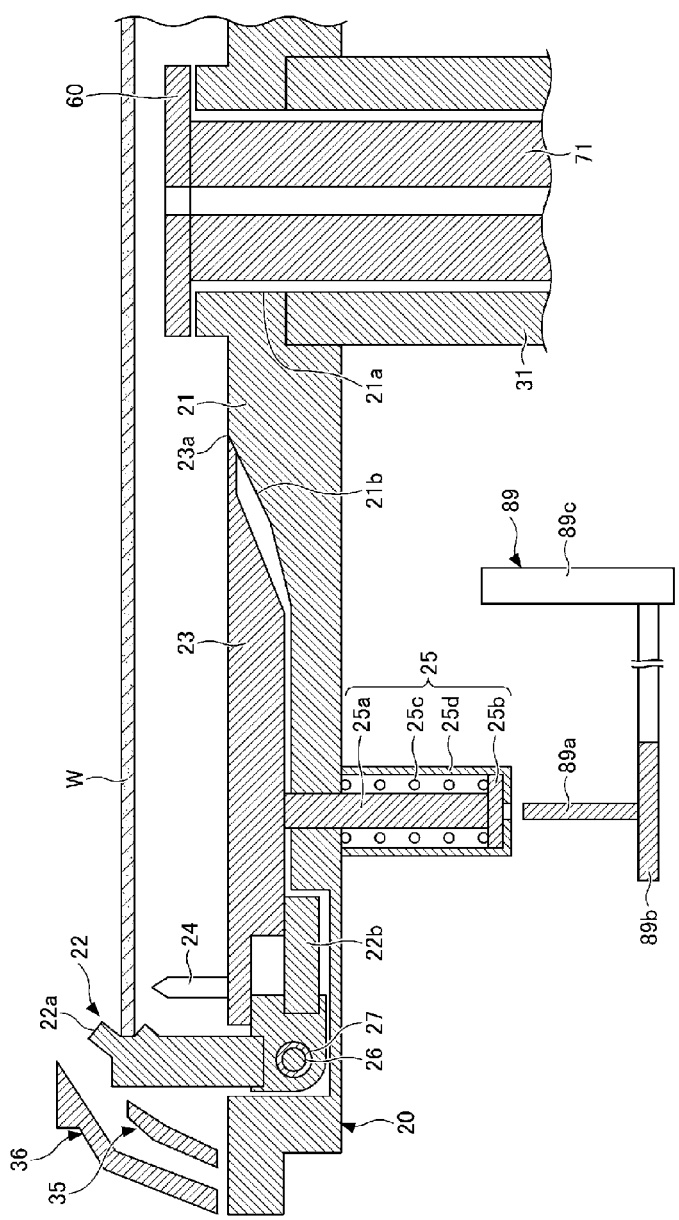
FIG. 10 is a cross-sectional view illustrating an example of the lowered position of a lift plate.
Figure 11:
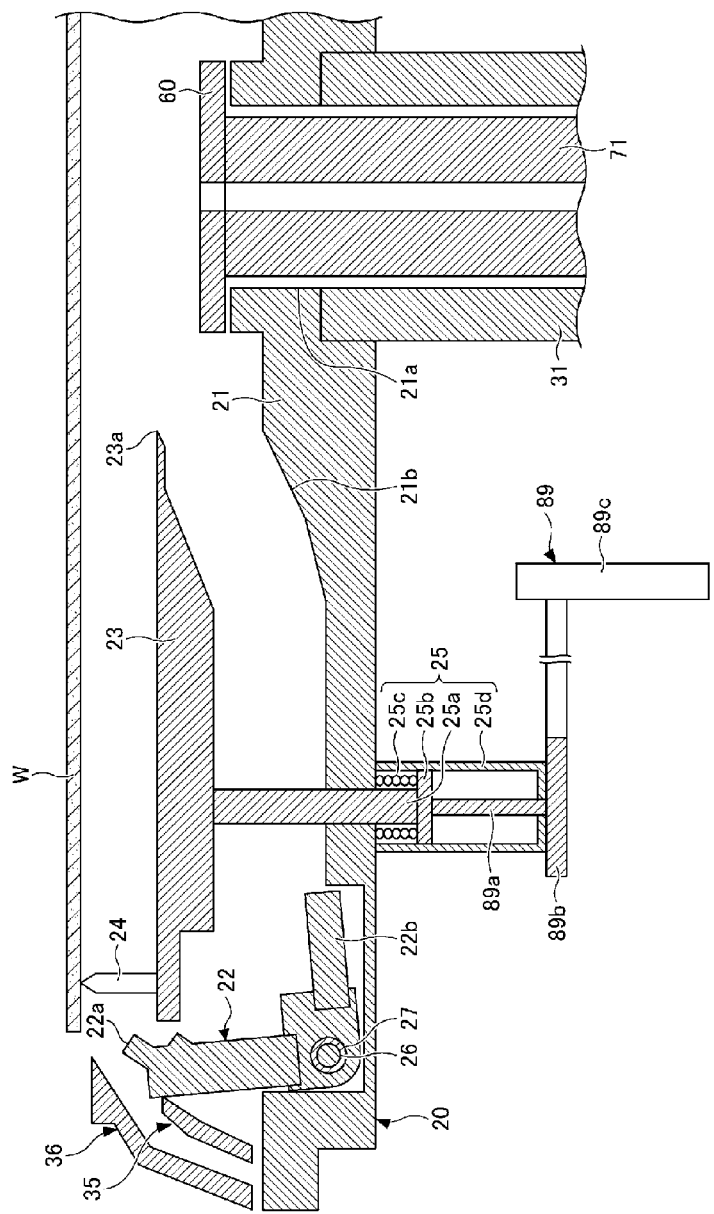
FIG. 11 is a cross-sectional view illustrating an example of the raised position of the lift plate.

Each gripping unit 22 moves, in conjunction with the up-and-down movement of the lift plate 23, between a gripping position for gripping the substrate W as illustrated in FIG. 10 and a releasing position for releasing the gripped substrate W as illustrated in FIG. 11. While the lifting unit 25 moves down the lift plate 23 from the raised position to the lowered position, the gripping unit 22 is pushed downward on the lower surface of the lift plate 23. As a result, the gripping unit 22 rotates about a rotating shaft 26, thus moving from the releasing position to the gripping position.

The gripping unit 22 has a claw portion 22a that sandwiches the peripheral edge of the substrate W from both upper and lower sides and a load receiving portion 22b that is pushed downward on the lower surface of the lift plate 23. While the lifting unit 25 lowers the lift plate 23 from the raised position to the lowered position, the load receiving portion 22b is pushed downward on the lower surface of the lift plate 23. As a result, the gripping unit 22 rotates about the rotating shaft 26, thus moving from the releasing position to the gripping position.

The substrate holding unit 20 has a pressure element 27 that applies pressure to the gripping unit 22 from the gripping position toward the releasing position. The pressure element 27 is, for example, a spring. While the lifting unit 25 moves up the lift plate 23 from the lowered position to the raised position, the gripping unit 22 is moved from the gripping position to the releasing position under the pressure exerted by the pressure element 27.

A recess 21b is provided on an upper surface of the base plate 21 so that the upper surface of the base plate 21 is flush with the upper surface of the lift plate 23 while the gripping unit 22 grips the peripheral edge of the substrate W as illustrated in FIG. 10. The recess 21b is provided in a ring shape to surround the through-hole 21a and accommodates the lift plate 23.

Figure 12:
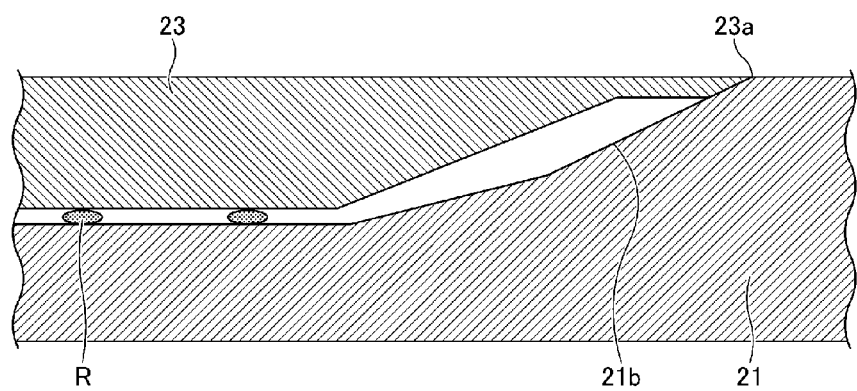
FIG. 12 is a cross-sectional view illustrating an example of a residue of a chemical liquid that has entered a gap between the lift plate and a base plate.

Next, referring to FIGS. 12 to 16, an example of cleaning of the substrate holding unit 20 will be described. As illustrated in FIG. 12, there is a case where a gas vaporized from a chemical liquid, or a mist-like chemical liquid enters a gap between the lift plate 23 and the base plate 21, leading to the adherence of the residue R of the chemical liquid. When the residue (R) adheres, it may prevent the lift plate 23 from completely moving down to the lowered position and the gripping unit 22 from completely moving to the gripping position, which potentially results in the gripping unit 22 not being able to securely grip the peripheral edge of the substrate W.

Figure 13:
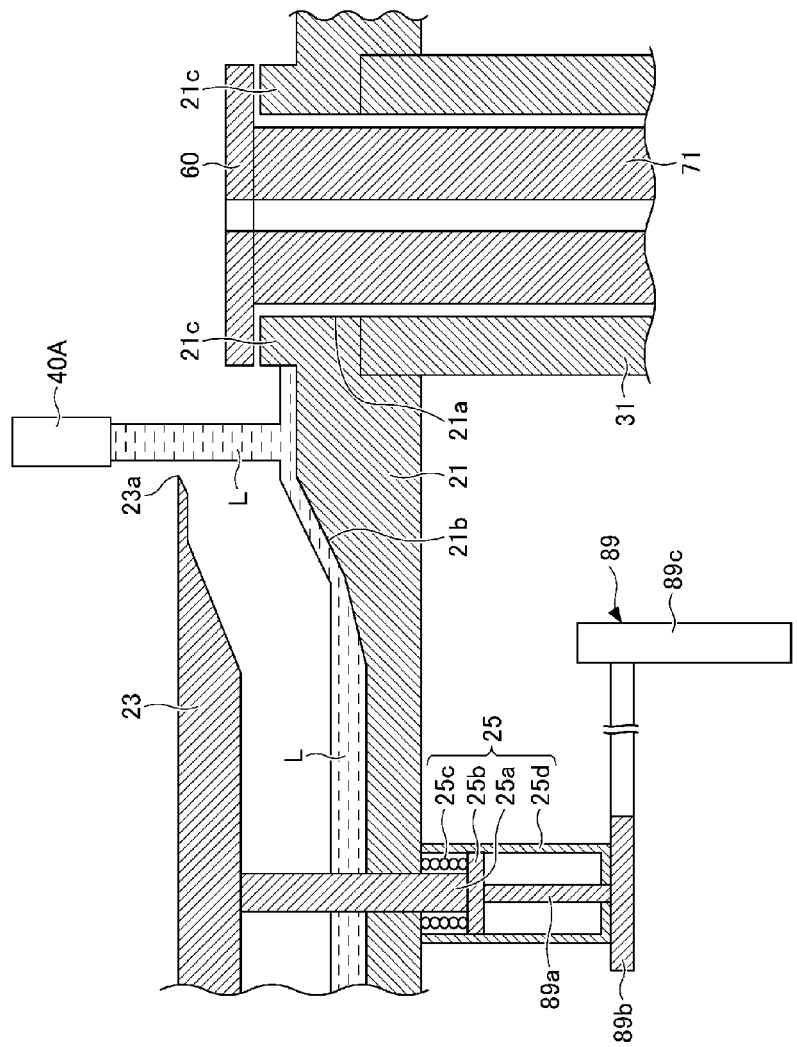
FIG. 13 is a cross-sectional view illustrating an example of a step in which the first nozzle ejects the cleaning liquid onto the base plate while the lift plate is spaced apart from the base plate by a lifting unit.

As illustrated in FIG. 13, the controller 90 performs a control that the first nozzle 40A ejects the cleaning liquid L onto the base plate 21 while the lifting unit 25 separates the lift plate 23 away from the base plate 21. The first nozzle 40A ejects the cleaning liquid L onto the base plate 21 to prevent it from reaching the lift plate 23. The first nozzle 40A ejects the cleaning liquid L inside the lift plate 23. The cleaning liquid L is stored in the recess 21b formed on the upper surface of the base plate 21. A ring-shaped weir portion 21c is provided at an upper end of the through-hole 21a in the base plate 21.

While the lifting unit 25 raises the lift plate 23, the rod 89a of the driving unit 89 is inserted to the inside of the cylinder 25d, and thus, the rotation of the substrate holding unit 20 by the rotation driving unit 30 is impossible. Accordingly, the first nozzle 40A ejects the cleaning liquid L while the rotation driving unit 30 stops the rotation of the substrate holding unit 20. It is not possible to utilize the rotation of the substrate holding unit 20 for expanding the supply range of the cleaning liquid L.

Figure 14:
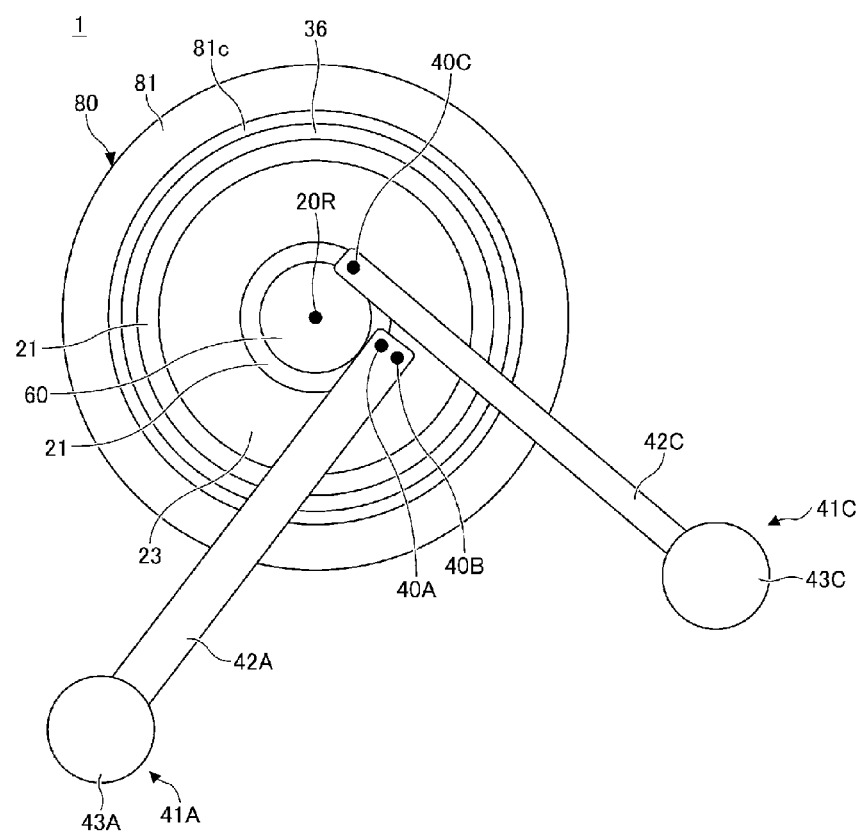
FIG. 14 is a plan view illustrating an example of the arrangement of the first nozzle and the third nozzle in the step of FIG. 13.

Therefore, as illustrated in FIG. 14, the controller 90 may perform a control that not only the first nozzle 40A but also the third nozzle 40C eject the cleaning liquid L onto the base plate 21. The first nozzle 40A and the third nozzle 40C eject the cleaning liquid L at different positions in the circumferential direction of the base plate 21. This allows the base plate 21 to store the cleaning liquid L over a wide range.

Figure 15:
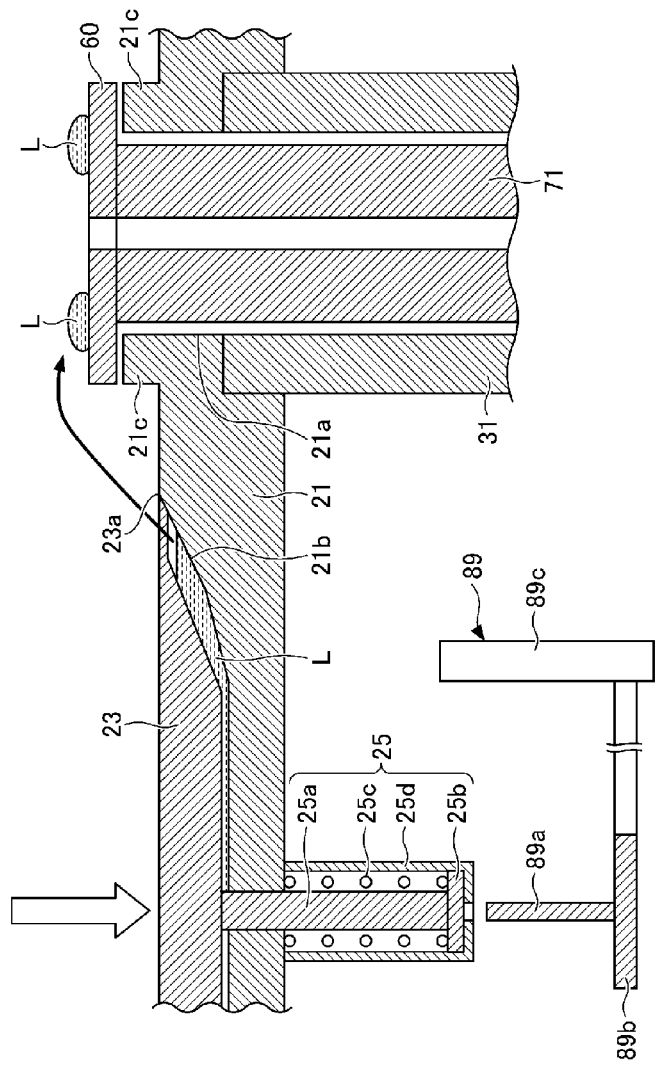
FIG. 15 is a cross-sectional view illustrating an example of a step in which the lifting unit lowers the lift plate after the step of FIG. 13.

Next, as illustrated in FIG. 15, the controller 90 performs a control that the lifting unit 25 moves down the lift plate 23, thereby bringing the lower surface of the lift plate 23 into contact with the collected cleaning liquid L on the base plate 21. This allows the cleaning liquid L to be supplied to the gap between the lift plate 23 and the base plate 21, enabling the removal of the residue R present in the gap.

However, when the lifting unit 25 lowers the lift plate 23 as illustrated in FIG. 15, the lift plate 23 crushes the cleaning liquid L, causing the cleaning liquid L to splash. As a result, the cleaning liquid L may adhere to the supply head 60.

Figure 16:
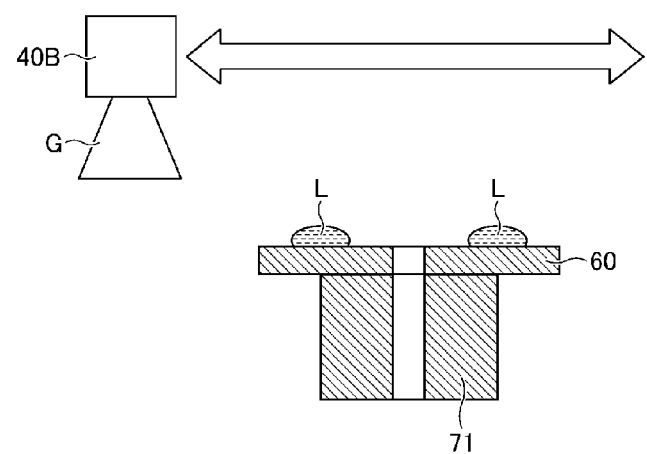
FIG. 16 is a cross-sectional view illustrating an example of a step of drying a supply head after the step of FIG. 15.

As illustrated in FIG. 16, the controller 90 may perform a control that the second nozzle 40B ejects a gas G toward the supply head 60 which is wet with the cleaning liquid L. For example, a nitrogen gas is used as the gas G. When the second nozzle 40B is a two-fluid nozzle, the supply of processing liquid to the second nozzle 40B is stopped, and only the gas is supplied.

The second nozzle 40B is arranged above the supply head 60 and ejects the gas G toward the supply head 60. It may blow away the cleaning liquid L adhered to the supply head 60, thus drying the supply head 60.

While the second nozzle 40B ejects the gas toward the supply head 60, the first nozzle mover 41A may particularly reciprocate the second nozzle 40B in a direction perpendicular to the rotation centerline 20R of the substrate holding unit 20.

Figure 17:
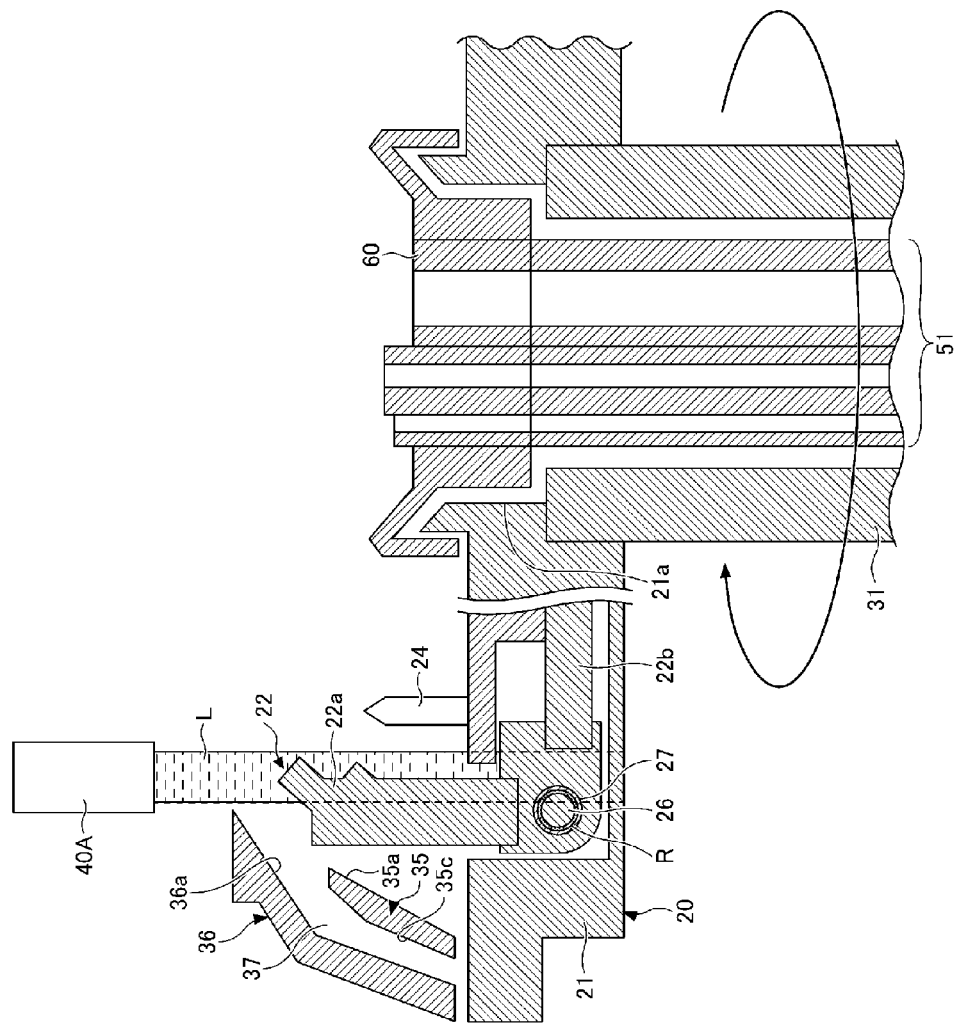
FIG. 17 is a cross-sectional view illustrating an example of cleaning of a gripping unit.

Next, referring mainly to FIGS. 17 to 19, an example of cleaning of the gripping unit 22 will be described. As already described above, the plurality of gripping units 22 move, respectively, between the gripping position for gripping the substrate W as illustrated in FIG. 10 and the releasing position for releasing the gripped substrate W as illustrated in FIG. 11. For example, the plurality of gripping units 22 rotate about respective rotating shaft 26 thereof, thereby moving between the gripping position and the releasing position. As illustrated in FIG. 17, there is a case where a gas vaporized from a chemical liquid, or a mist-like chemical liquid enters a sliding region (e.g., rotating shaft 26) of each gripping unit 22, leading to the adherence of the residue R of the chemical liquid. When the residue R adheres to the sliding region of the gripping unit 22, it may prevent the movement of the gripping unit 22, which potentially results in the gripping unit 22 not being able to securely grip the peripheral edge of the substrate W.

As illustrated in FIG. 17, the controller 90 performs a control that the first nozzle 40A ejects the cleaning liquid L to the plurality of gripping units 22 while the gripping units 22 are in the releasing position. While the plurality of gripping units 22 are in the releasing position, that is, while the plurality of gripping units 22 are not holding the substrate W, the substrate W does not disturb the supply of the cleaning liquid L to the gripping units 22. This allows for the efficient supply of the cleaning liquid L to the sliding region of each gripping unit 22, thus preventing the adherence of the residue R. It is also possible to remove the residue R. The cleaning liquid L is not particularly limited as long as it is capable of preventing the adherence of the residue R or capable of removing the residue R, but is, for example, a rinse liquid such as DIW. The cleaning liquid L prevents the adherence of the residue R, for example, by dissolving components of the residue R. Alternatively, the cleaning liquid L removes the residue R by dissolving the residue R.

When performing a control that the first nozzle 40A ejects the cleaning liquid L to the plurality of gripping units 22 while the gripping units 22 are in the releasing position as illustrated in FIG. 17, the controller 90 may perform a control that the rotation driving unit 30 rotates the substrate holding unit 20, or may perform a control that the rotation driving unit 30 stops the substrate holding unit 20 without rotating the substrate holding unit 20. In the latter case, the supply of the cleaning liquid L may be concentrated at one gripping unit 22 for a long period of time. In this case, the rotation driving unit 30 may rotate the substrate holding unit 20 after the supply of the cleaning liquid L to one gripping unit 22 ends and before the supply of the cleaning liquid L to another gripping unit 22 begins.

The controller 90 may perform a control that the first nozzle 40A ejects the cleaning liquid L to the plurality of gripping units 22 while the gripping units 22 are in the releasing position as illustrated in FIG. 17, but may perform a control that the second nozzle 40B ejects the cleaning liquid L to the gripping units 22. The second nozzle 40B ejects the cleaning liquid L in a mist form. By atomizing the cleaning liquid L, it becomes easier for the cleaning liquid L to enter the sliding region of each gripping unit 22. The second nozzle 40B may be a two-fluid nozzle that ejects the cleaning liquid L in a mist form under gas pressure. This allows for the cleaning liquid L to be atomized under gas pressure and also enhances the flow of the cleaning liquid L under gas pressure.

Figure 18:
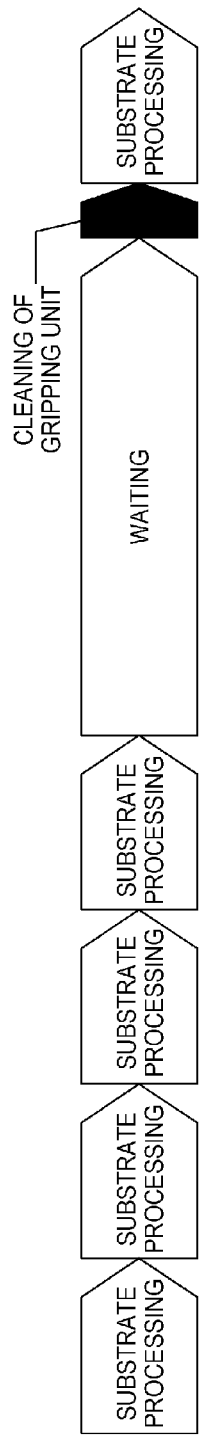
FIG. 18 is a diagram illustrating an example of the timing of cleaning of the gripping unit.
Figure 19:
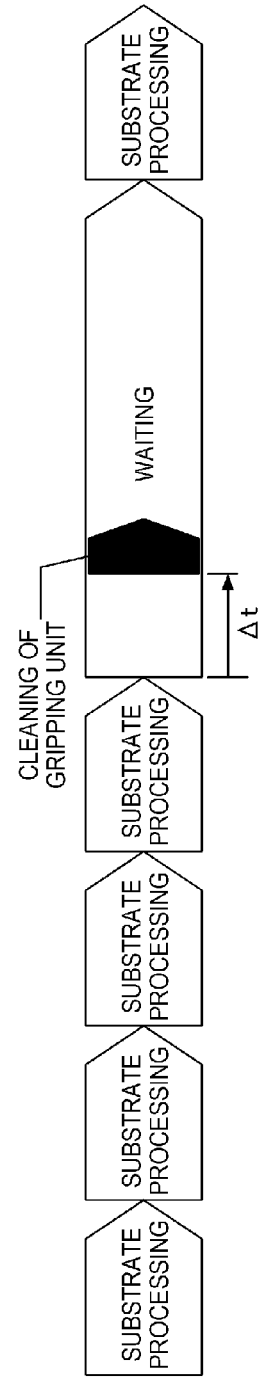
FIG. 19 is a diagram illustrating another example of the timing of cleaning of the gripping unit.

However, the substrate processing apparatus 1 processes a plurality of substrates W constituting one lot, one by one in order, as illustrated in FIGS. 18 and 19. One lot is composed of, for example, "n" substrates W stored in one cassette. "n" may be a natural number greater than or equal to 2, and is not particularly limited, but is, for example, 25. As illustrated in FIGS. 18 and 19, there is a waiting time after the processing of one lot ends and before the processing of another lot begins. During the waiting time, the chemical liquid and the like adhering to the gripping units 22 evaporate, resulting in the concentration of components of the chemical liquid, and consequently, the formation of the residue R.

Therefore, as illustrated in FIG. 18, the controller 90 may perform cleaning of the gripping units 22 immediately before the processing of another lot begins. This allows for the removal of the residue R. Further, as illustrated in FIG. 19, the controller 90 may perform cleaning of the gripping units 22 when the elapsed time from the end of the processing of one lot reaches a set time Δt. This may prevent the drying of the gripping units 22 and may prevent the adherence of the residue R.

According to one aspect of the present disclosure, it is possible to remove a residue of a chemical liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate holder including a base plate in a horizontal posture and a plurality of grippers that grips a peripheral edge of a substrate, and configured to horizontally hold the substrate spaced apart from the base plate by the plurality of grippers;
   a rotation driver configured to rotate the substrate holder;
   a first rotational ring surrounding a peripheral edge of a lower surface of the substrate held by the substrate holder, and configured to rotate together with the substrate holder;
   a second rotational ring provided outside the first rotational ring, surrounding a peripheral edge of an upper surface of the substrate held by the substrate holder, and configured to rotate together with the substrate holder; and
   a first nozzle configured to eject a cleaning liquid from above an entrance of a rotational flow path toward the entrance of the rotational flow path, the rotational flow path being formed between the first rotational ring and the second rotational ring,
   wherein at least a portion of the first rotational ring is exposed through the rotational flow path when viewed from above the second rotational ring.

2. The substrate processing apparatus according to claim 1, further comprising:
   a first nozzle mover configured to move the first nozzle in a direction perpendicular to a rotation centerline of the substrate holder; and
   a controller,
   wherein the controller performs a control that the first nozzle ejects the cleaning liquid toward the entrance of the rotational flow path while the first nozzle mover stops the first nozzle, and the rotation driver rotates the first rotational ring and the second rotational ring together with the substrate holder.

3. The substrate processing apparatus according to claim 2, wherein the controller performs a control that the first nozzle ejects the cleaning liquid toward the substrate holder while the first nozzle mover moves the first nozzle in the direction perpendicular to the rotation centerline of the substrate holder, and the rotation driver rotates the substrate holder.

4. The substrate processing apparatus according to claim 1, wherein the first nozzle supplies the cleaning liquid to the entrance of the rotational flow path, and simultaneously, supplies the cleaning liquid to the second rotational ring.

5. The substrate processing apparatus according to claim 1, further comprising:
   a second nozzle configured to eject the cleaning liquid in a mist form from above the entrance of the rotational flow path toward the entrance of the rotational flow path.

6. The substrate processing apparatus according to claim 5, wherein the second nozzle is a two-fluid nozzle configured to ejects the cleaning liquid in a mist form under a gas pressure.

7. The substrate processing apparatus according to claim 6, further comprising:
   a controller,
   wherein the controller alternately repeats a control that the rotation driver rotates the substrate holder at a first rotational speed while the second nozzle ejects the cleaning liquid toward the entrance of the rotational flow path, and a control that the rotation driver rotates the substrate holder at a second rotational speed greater than the first rotational speed while the second nozzle stops ejection of the cleaning liquid.

8. The substrate processing apparatus according to claim 1, wherein the substrate holder includes:
   a lift plate provided on the base plate to be movable up and down;
   a lift pin protruding upward from the lift plate to support the substrate from below; and
   a lifter configured to move the lift pin up and down together with the lift plate, and
   wherein the substrate processing apparatus further comprises a controller, and the controller performs a control that the first nozzle ejects the cleaning liquid onto the base plate while the lifter separates the lift plate away from the base plate, and a control that the lifter moves down the lift plate, thereby bring a lower surface of the lift plate into contact with the cleaning liquid collected on the base plate.

9. The substrate processing apparatus according to claim 8, wherein each gripper moves, in conjunction with an up-and-down movement of the lift plate, between a gripping position where the gripper grips the substrate and a releasing position where the gripper releases the gripped substrate, and wherein the substrate holder includes a spring that biases the gripper from the gripping position toward the releasing position.

10. The substrate processing apparatus according to claim 8, further comprising:
a supply head configured to eject a fluid toward the lower surface of the substrate held by the substrate holder; and
a second nozzle configured to eject a gas toward the supply head that is wet with the cleaning liquid.

11. The substrate processing apparatus according to claim 1, further comprising:
a first nozzle mover configured to move the first nozzle in a direction perpendicular to a rotation centerline of the substrate holder;
an exhaust cup surrounding the second rotational ring and forming an exhaust flow path between the second rotating ring and the exhaust cup;
a third nozzle configured to eject the cleaning liquid;
a third nozzle mover configured to move the third nozzle in a direction perpendicular to the rotation centerline of the substrate holder; and
a controller,
wherein, when viewed from above, a movement trajectory of the first nozzle and a movement trajectory of the third nozzle intersect at the rotation centerline of the substrate holder, the movement trajectory of the first nozzle and an inner periphery of the exhaust cup intersect at a first point and a second point, and the movement trajectory of the third nozzle and the inner periphery of the exhaust cup intersect at a third point and a fourth point, and
wherein the controller performs a control that the first nozzle eject the cleaning liquid toward an entrance of the exhaust flow path at each of the first point and the second point, and a control that the third nozzle eject the cleaning liquid toward the entrance of the exhaust flow path at each of the third point and the fourth point.

12. The substrate processing apparatus according to claim 1, wherein each of the first rotational ring and the second rotational ring is made of a ceramic material.

13. The substrate processing apparatus according to claim 2, wherein the controller performs the control in a state where the substate is not held by the substrate holder.

* * * * *